(12) United States Patent
Lee et al.

(10) Patent No.: US 7,683,496 B2
(45) Date of Patent: Mar. 23, 2010

(54) MISALIGNMENT DETECTION DEVICES

(75) Inventors: Chun-Yu Lee, Tainan County (TW); Shih-Ping Chou, Taoyuan County (TW); Chien-Liang Chen, Yunlin County (TW); Wen-Hung Lai, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 603 days.

(21) Appl. No.: 11/535,141

(22) Filed: Sep. 26, 2006

(65) Prior Publication Data
US 2008/0006952 A1 Jan. 10, 2008

(30) Foreign Application Priority Data
Jul. 6, 2006 (TW) .............. 95124605 A

(51) Int. Cl.
*H01L 23/544* (2006.01)
(52) U.S. Cl. .............. 257/797; 257/E23.179
(58) Field of Classification Search .......... 257/797, 257/E23.179
See application file for complete search history.

(56) References Cited

U.S. PATENT DOCUMENTS

| | | | | |
|---|---|---|---|---|
| 5,302,854 | A * | 4/1994 | Nishiguchi et al. | 257/737 |
| 6,037,666 | A * | 3/2000 | Tajima | 257/777 |
| 2002/0191835 | A1* | 12/2002 | Lu et al. | 382/151 |
| 2006/0202359 | A1* | 9/2006 | Chen | 257/797 |

* cited by examiner

*Primary Examiner*—Allan R. Wilson
(74) *Attorney, Agent, or Firm*—Thomas, Kayden, Horstemeyer & Risley

(57) ABSTRACT

A misalignment detection device comprising a substrate, at least one integrated circuit (IC), and at least one detection unit is disclosed. The substrate comprises a first positioning pad and a second positioning pad adjacent to the first positioning pad. The integrated circuit is disposed on the substrate and comprises a first positioning bump and a second positioning bump adjacent to the first positioning bump. The first and second positioning bumps substantially correspond to the first and second positioning pads, respectively. The at least one detection unit is electrically coupled to the substrate, wherein the detection unit outputs a fault signal in response to a positioning shift occurring between the first and second positioning pads and the first and second positioning bumps.

10 Claims, 6 Drawing Sheets

MISALIGNMENT DETECTION DEVICES

BACKGROUND OF THE INVENTION

1. Field of the Invention

The present invention relates to a misalignment detection device, and more particularly, to a misalignment detection device applied in pressure exerted on an integrated circuit and at least one substrates.

2. Description of the Related Art

In nowadays electronic devices, elements are connected to a major circuit through conductive films, such as anisotropic conductive films (ACFs), which are formed by mixing non-conductive resins and conductive particles. FIG. 1A is a cross-sectional view of a conductive particle 1. The diameter of the conductive particle 1 is about 3 μm to about 5 μm. The center portion 1a of the conductive particle 1 is formed by a polymer, and the conductive particle 1 is covered externally by a metal conductor 1b, such as gold, silver, nickel, tin, copper, or the like.

ACFs are typically used for the manufacture of displays. In a manufacturing method, an ACF is used to directly dispose the driving chips of a panel on a glass substrate, known as the Chip-On-Glass (COG) procedure or an ACF is used to dispose the driving chips on a flexible printed circuit (FPC), known as the Chip-On-Film (COF) afterward the FPC is electrically coupled to a substrate. In addition, an ACF is used to dispose the driving chips on a printed circuit board (PCB), known as the Chip-On-Board (COB).

FIG. 1B shows pressure between a substrate and a driving chip through an ACF. Referring to FIG. 1B, a substrate 10 can be a glass substrate, an FPC, a PCB, or other circuit boards. During manufacture, metal pads 10a are formed on the substrate 10 to transmit signals or power, such as voltage level, current, or likes. Thick bumps 11a are formed on pins of the driving chip 11. An ACF 12 is then disposed between the driving chip 11 and the substrate 10. ACF 12 is heated to increase adhesion capability, and then applying a pressure on the driving chip 11 and the substrate 10 so as to assembly. Note that the pads 10a and the corresponding bumps 11a must be aligned.

Since each bump 11a has a fixed thickness, conductive particles 1 are compressed between the pads 10a and the bumps 11a. Through metal conductors 1b externally covering the conductive particles 1, the compressed conductive particles 1 electrically connected to the bumps 11a and the pads 10a. Thus, the motion of the driving chip 11 and the coupling of circuits are performed at the same time by ACFs.

During manufacture, the accuracy of disposition alignment is determined by the naked eye of the operator, thus, a great number of detection operators is required. Moreover, the accuracy of disposition alignment may be suffered due to erroneous detection by operators or an insufficient sampling rate.

As shown in FIG. 2A, the misalignment occurs between the bump 11a of the driving chip 11 and the pad 10a of the substrate 10. The bump 11a is electrically connected to a pad adjacent to the corresponding pad 10a, and the misalignment thus occurs. In another case as shown in FIG. 2B, although the bump 11a is not electrically connected to the next pad, a short path is formed between the bump 11a and the pad adjacent to the corresponding pad 10a via the conductive particle 1. If erroneous or incomplete detection occurred by the operators leading to produce the defective products.

BRIEF SUMMARY OF THE INVENTION

Misalignment detection devices are provided. An exemplary embodiment of a misalignment detection device comprises a substrate, at least one integrated circuit (IC), and at least one detection unit. The substrate comprises a first positioning pad and a second positioning pad adjacent to the first positioning pad. The integrated circuit is disposed on the substrate and comprises a first positioning bump and a second positioning bump adjacent to the first positioning bump. The first and second positioning bumps substantially correspond to the first and second positioning pads, respectively. The at least one detection unit is electrically coupled to the substrate, wherein The detection unit outputs a fault signal in response to a positioning shift occurring between the first and second positioning pads and the first and second positioning bumps.

A detailed description is given in the following embodiments with reference to the accompanying drawings.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The following description is of the preferred embodiments of carrying out the present invention. This description is made for the purpose of illustrating the general principles of the present invention and should not be taken in a limiting sense. The scope of the present invention is best determined by reference to the appended claims.

Figure 1A:
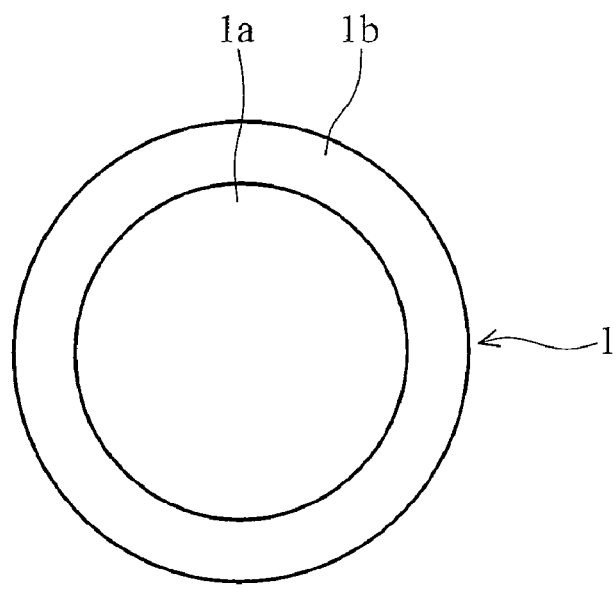
FIG. 1A is a cross-sectional view of a conductive particle of an ACF.
Figure 1B:
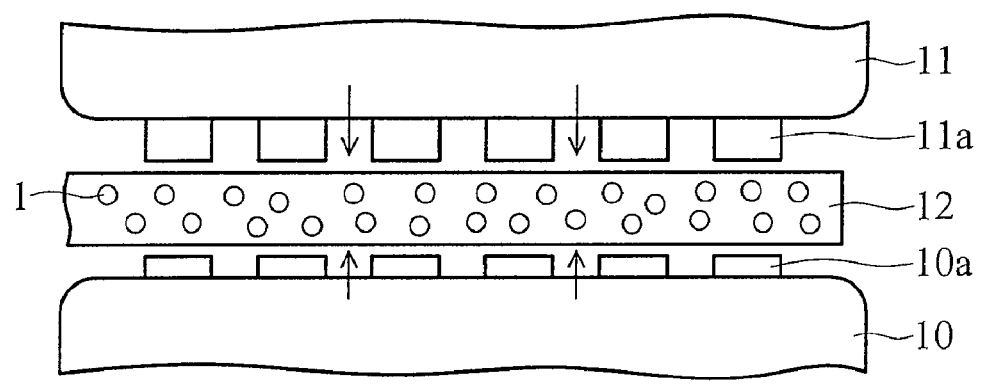
FIG. 1B shows pressure between a substrate and a driving chip through an ACF.
Figure 2A:
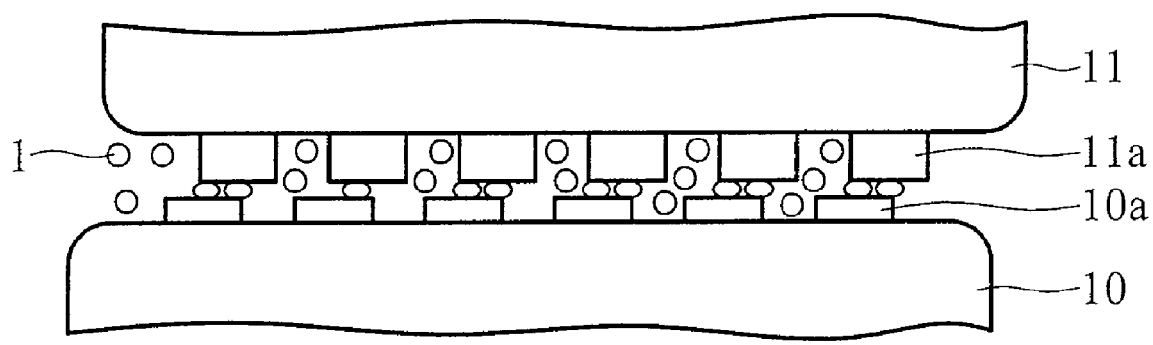
FIG. 2A shows misalignment occurring between a driving chip and a substrate.
Figure 2B:
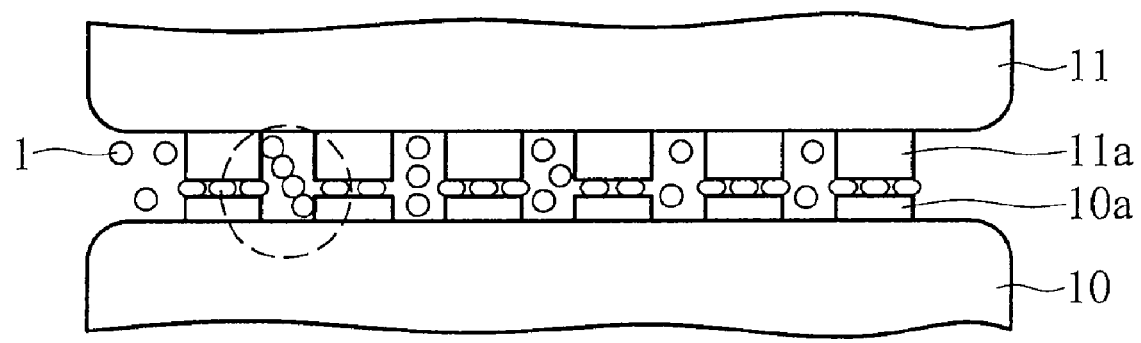
FIG. 2B shows a short path formed by conductive particles of an ACF.
Figure 3A:
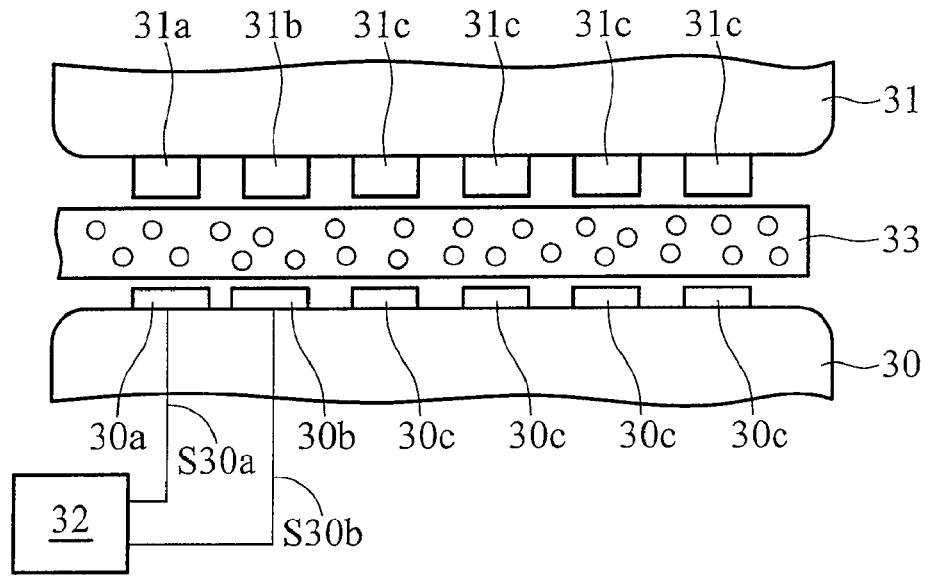
FIG. 3A shows a first embodiment of a misalignment detection device of the present invention.

Misalignment detection devices are provided. In a first embodiment of a misalignment detection device in FIG. 3A of the present invention, a misalignment detection device 3 comprises a substrate 30, at least one integrated circuit (IC) 31, and at least one detection unit 32. In present embodiment of the invention, the substrate 30 can be a transparent substrate (such as a glass substrate, or a quartz substrate), an opaque substrate (such as a wafer or ceramic substrate), or flexibility substrate (such as acrylic polymer, rubber, epoxy polymer, ester polymer, or likes). In the following description of FIG. 3A, a glass substrate is given as an example for the substrate 30, but non-limited it. Referring to FIG. 3A, the substrate 30 comprises a plurality of pads divided into function pads 30c and two adjacent positioning pads 30a and 30b. The distance between any two of the function pads 30c is substantially greater than the distance between of the positioning pads 30a and 30b. The IC 31 comprises a plurality of bumps divided into function bumps 31c and two adjacent positioning bumps 31a and 31b. An ACF 33 is disposed between the substrate 30 and the IC 31. The ACF 33 is heated to increase adhesion capability, and then applying a pressure on the substrate 30 and the IC 31. Preferably, the function pads 30c and the substantially corresponding function bumps 31c should be aligned, and the positioning pads 30a and 30b and the substantially corresponding position bumps 31a and 31b should be aligned.

In the present embodiment of the invention, the positioning pads 30a and 30b receive signals S30a and S30b having substantially different voltage levels, respectively. When the misalignment detection device 3 is applied in a display device, at least one of the signals S30a and S30b is disregards display device functions. In other words, at least one of the signals S30a and S30b is not provided by the display device. For example, the signal S30a has the same level as a common voltage Vcom of the display device, and the signal S30b has a ground level GND provided by the misalignment detection device 3 or an external device (not shown).

Figure 3B:
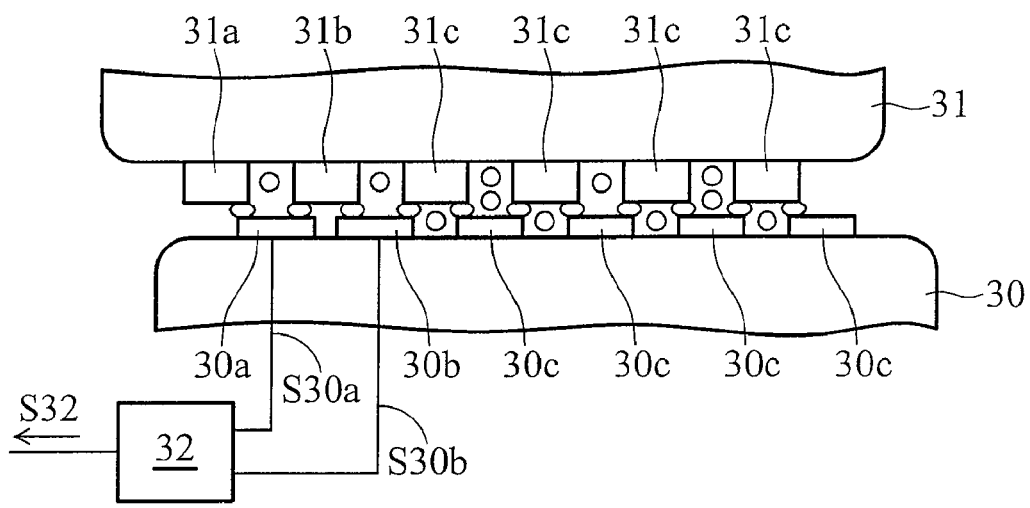
FIG. 3B shows misalignment occurring in the embodiment of the misalignment detection device of FIG. 3A.

The detection unit 32 is electrically coupled to the substrate 30 and detects the signals S30a and S30b. As shown in FIG. 3B, when the positioning shift occurs between the substrate 30 and the IC 31, the detection unit 32 outputs a fault signal S32. In detail, when the positioning shift occurs between the substrate 30 and the IC 31 and the misalignment is caused between the function pads 30c and the function bumps 31c, the positioning pad 30a is electrically coupled to the positioning bump 31b or the positioning pad 30b is electrically coupled to the positioning bump 31a, at the same time, one function pad 30c is electrically coupled to a function bump adjacent to the substantially corresponding function bump 31c. One of the signals S30a and S30b is not at the original voltage level. When detecting that the voltage level of one of the signals S30a and S30b is changed, the detection unit 32 outputs the fault signal S32 to indicate a positioning shift between the substrate 30 and the IC 31. The display device displays images incorrectly according to the fault signal S32, and the disposition of the substrate 30 and the IC 31 faults.

In the present embodiment of the invention, the distance between two function pads 30c is substantially greater than the distance between the positioning pads 30a and 30b. When the positioning shift occurs between the substrate 30 and the IC 31, the positioning pad 30a has been electrically coupled to the positioning bump 31b or the positioning pad 30b has been electrically coupled to the positioning bump 31a, notwithstanding any one of the function pads 30c may not yet be electrically coupled to a function bump adjacent to the substantially corresponding function bump 31c causing the misalignment. Thus, the positioning shift between the substrate 30 and the IC 31 can be determined in advance, decreasing the probability of the misalignment.

Figure 4:
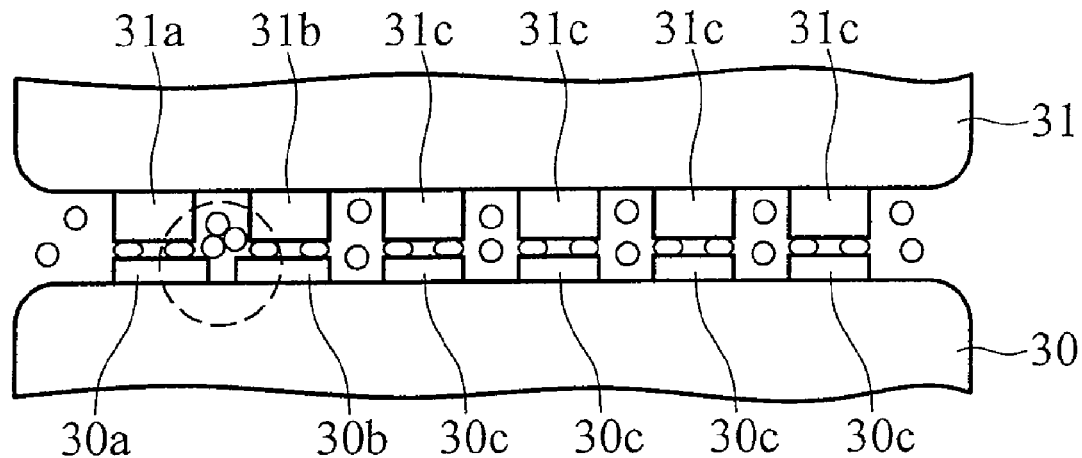
FIG. 4 shows a short path formed by conductive particles of an ACF in an embodiment of a misalignment detection device.
Figure 5:
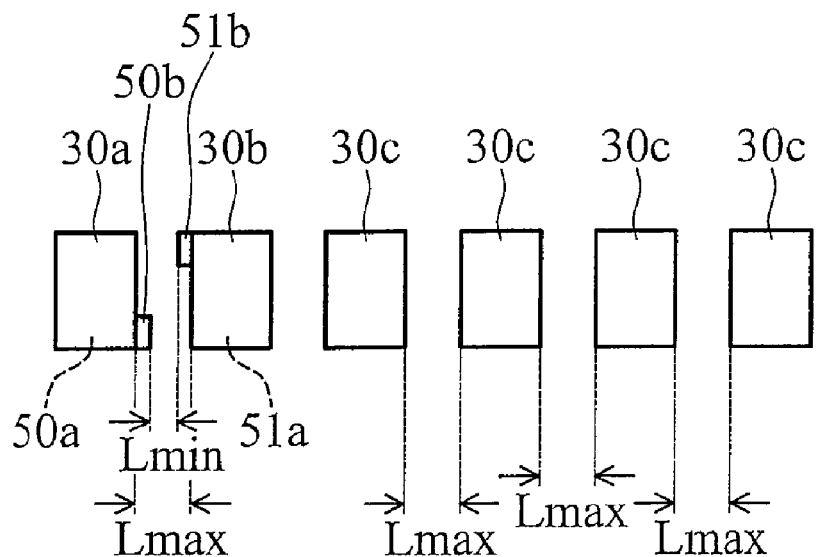
FIG. 5 shows distances between positioning pads and between function pads in an embodiment of a misalignment detection device of the present invention.

In FIG. 3A, the distance between two function pads 30c is substantially greater than the distance between the positioning pads 30a and 30b. In some cases, although the positioning shift does not occur between the substrate 30 and the IC 31, the conductive particles of the ACF 33 form a short path between the positioning bumps and the positioning pads due to the shorter distance between the positioning pads 30a and 30b, as shown in FIG. 4. In order to prevent the short path formed by the conductive particles of the ACF 33, the forms of the positioning pads 30a and 30b can be made as shown in FIG. 5. In FIG. 5, the positioning pad 30a comprising two portions 50a and 50b, and the positioning pad 31a comprising two portions 51a and 51b. The distance between the positioning pads 30a and 30b has the maximum length Lmax and the minimum length Lmin. It is assumed that the distance between two function pads 30c is about 20 um, the maximum length Lmax is substantially equal to 20 um, and the minimum length Lmin is substantially less than 20 um. Thus, when the positioning shift occurs between the substrate 30 and the IC 31 and the misalignment has not yet been caused between the function pads 30c and the function bumps 31c, the positioning pad 30a has been electrically coupled to the positioning bump 31b or the positioning pad 30b is coupled to the positioning bump 31a, thereby the positioning shift between the substrate 30 and the IC 31 can be known in advance. Moreover, because the distance between the portions 50b and 51b of the positioning pads 30a and 30b is less than about 20 um, the short path formed by the conductive particles of the ACF 33 can be prevented.

In the present embodiments of the invention, the positioning bumps 31a and 31b are disposed on an outer side of the IC 31, in other words, the positioning bumps 31a and 31b are disposed on one of the two sides of the function bumps 31c.

Figure 6A:
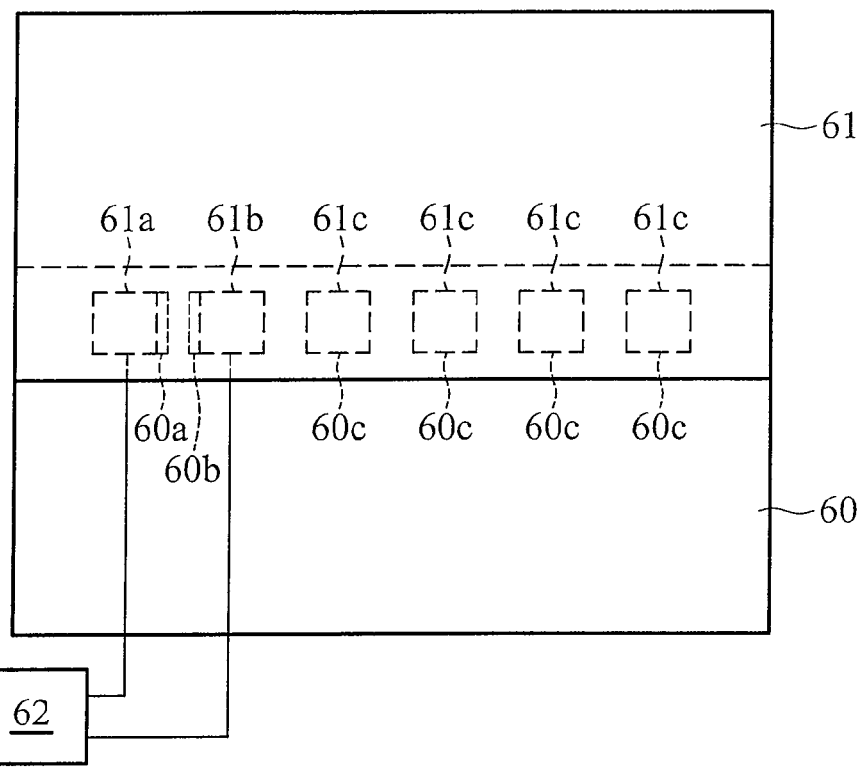
FIG. 6A shows a second embodiment of a misalignment detection device of the invention.
Figure 6B:
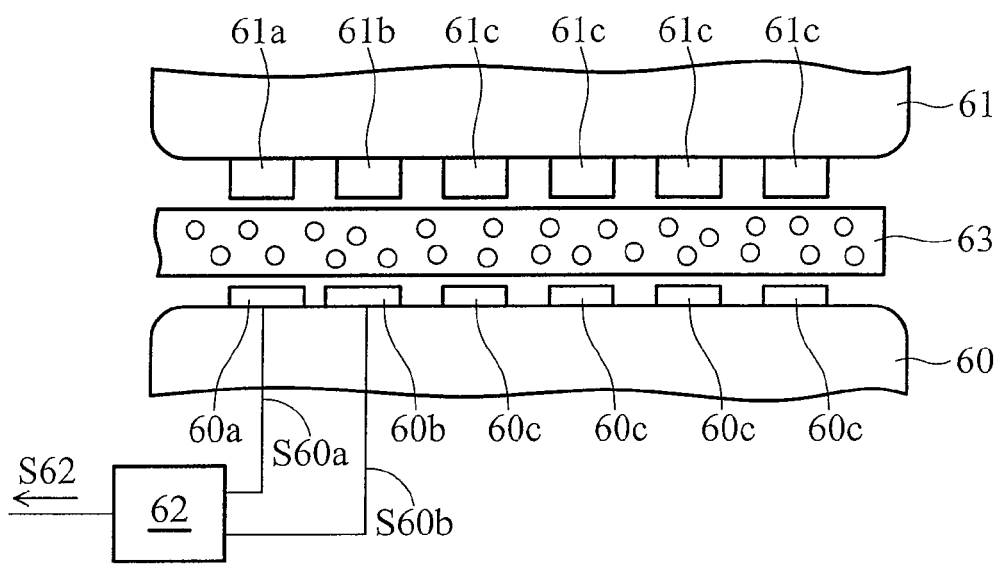
FIG. 6B is a cross-sectional view of the exemplary embodiment of the misalignment detection device in FIG. 6A.

In a second embodiment of a misalignment detection device in FIG. 6A of the present invention, a misalignment detection device 6 comprises a first substrate 60, a second substrate 61, and at least one detection unit 62. The second substrate 61 is electrically coupled to and disposed on partly of the first substrate 60. The first substrate 60 can be a printed circuit board (PCB), a flexible printed circuit (FPC), COF, or a combination thereof. The second substrate 61 can be a PCB, an FPC, or a combination thereof. In present embodiment of the invention, the first substrate 60 is a PCB, and the second substrate 61 is an FPC is given as an example, but non-limited it. Referring to FIG. 6A, the first substrate 60 comprises a plurality of electrodes divided into function electrodes 60c and two adjacent positioning electrodes 60a and 60b, and the second substrate 61 comprises a plurality of electrodes divided into function electrodes 61c and two adjacent positioning electrodes 61a and 61b. Referring to FIG. 6b, an ACF 63 is disposed between the first substrate 60 and the second substrate 61. The ACF 63 is heated to increase adhesion capability, and then applying a pressure on the first substrate 60 and the second substrate 61. Preferably, the function electrodes 60c of the first substrate 60 and the function electrodes 61c of the first substrate 60 should be aligned, and the positioning electrodes 60a and 60b of the first substrate 60 and the positioning electrodes 61a and 61b of the first substrate 60 should be aligned.

In the present embodiment of the invention, at least one of the distance between two of the function electrodes 60c of the first substrate 60 is substantially greater than the distance between the positioning electrodes 60a and 60b or the distance between two function electrodes 61c of the second substrate 61 is substantially greater than the distance between the positioning electrodes 61a and 61b. In the following description, the distance between two function electrodes 60c of the first substrate 60 is substantially greater than the distance between the positioning electrodes 60a and 60c.

The positioning electrodes 60a and 60b respectively receives signals S60a and S60b which have substantially different voltage levels. When the misalignment detection device 6 is applied in a display device. At least one of the signals S60*a* and S60*b* disregards display device function. In other words, at least one of the signals S60*a* and S60*b* is not provided by the display device. For example, the signal S60*a* has the same level as a common voltage Vcom of the display device, and the signal S60*b* has a ground level GND provided by the misalignment detection device 6 or an external device (not shown).

The detection unit 62 is electrically coupled to or disposed on the first substrate 60. The detection unit 62 detects the signals S60*a* and S60*b*. When a positioning shift occurs between the first substrate 60 and the second substrate 61, the detection unit 62 outputs a fault signal S62. In detail, when the positioning shift occurs and the misalignment is thus caused between the function electrodes 60*c* and the function electrodes 61*c*, the positioning electrode 60*a* is electrically coupled to the positioning electrode 61*b* or the positioning electrode 60*b* is electrically coupled to the positioning electrode 61*a*, at the same time, one function electrode 60*c* of the first substrate 60 is electrically coupled to a function electrode adjacent to the substantially corresponding function electrode 61*c* of the second substrate 61. One of the signals S60*a* and S60*b* is not at the original voltage level. When detecting that the voltage level of one of the signals S60*a* and S60*b* is changed, the detection unit 62 outputs the fault signal S62 to indicate the positioning shift occurs between the first substrate 60 and the second substrate 61.

In the present embodiment, the distance between two function electrodes 60*c* of the first substrate 60 is substantially greater than the distance between the positioning electrodes 60*a* and 60*b* thereof. When the positioning shift occurs between the first substrate 60 and the second substrate 61, the positioning electrode 60*a* has been electrically coupled to the positioning electrode 61*b* or the positioning electrode 60*b* has been electrically coupled to the positioning electrode 61*a* although any one of the function electrodes 60*c* of the first substrate 60 is not yet electrically coupled to a function electrode adjacent to the substantially corresponding function electrode 61*c* of the second substrate 61 causing misalignment. Thus, the positioning shift between the first substrate 60 and the second substrate 61 can be known in advance, decreasing the probability of the misalignment.

In FIG. 6A, the distance between two function electrodes 60*c* is substantially greater than the distance between the positioning electrodes 60*a* and 60*b*. In some cases, although the positioning shift does not occur between the first substrate 60 and the second substrate 61, the conductive particles of the ACF 63 form a short path between the positioning electrodes 60*a* and 60*b* and the positioning electrodes 61*a* and 61*b* due the shorter distance between the positioning electrodes 60*a* and 60*b*. In order to prevent the short path formed by the conductive particles of the ACF 63, the positioning electrodes 60*a* and 60*b* can be formed as shown in FIG. 5. The distance between the positioning electrodes 60*a* and 60*b* has the maximum length Lmax and the minimum length Lmin. It is assumed that the distance between two function electrodes 60*c* is about 20 um, the maximum length Lmax is substantially equal to 20 um, and the minimum length Lmin is substantially less than 20 um. Thus, when the positioning shift occurs between the first substrate 60 and the second substrate 61 and the misalignment is not yet caused between the function electrodes 60*c* and the function electrodes 61*c*, the positioning electrode 60*a* has been electrically coupled to the positioning electrode 61*b* or the positioning electrode 60*b* is electrically coupled to the positioning electrode 61*a*, thereby the positioning shift between the first substrate 60 and the second substrate 61 can be known in advance. Moreover, because the distance between one portion of the positioning electrode 60*a* and one portion of the positioning electrode 60*b* is less than about 20 um, the short path formed by the conductive particles of the ACF 63 can be prevented.

In the present embodiment, the positioning electrodes 60*a* and 60*b* are disposed on an outer side of the first substrate 60, in other words, the positioning electrodes 60*a* and 60*b* are disposed on one of the two sides of the function electrodes 60*c*.

Figure 7:
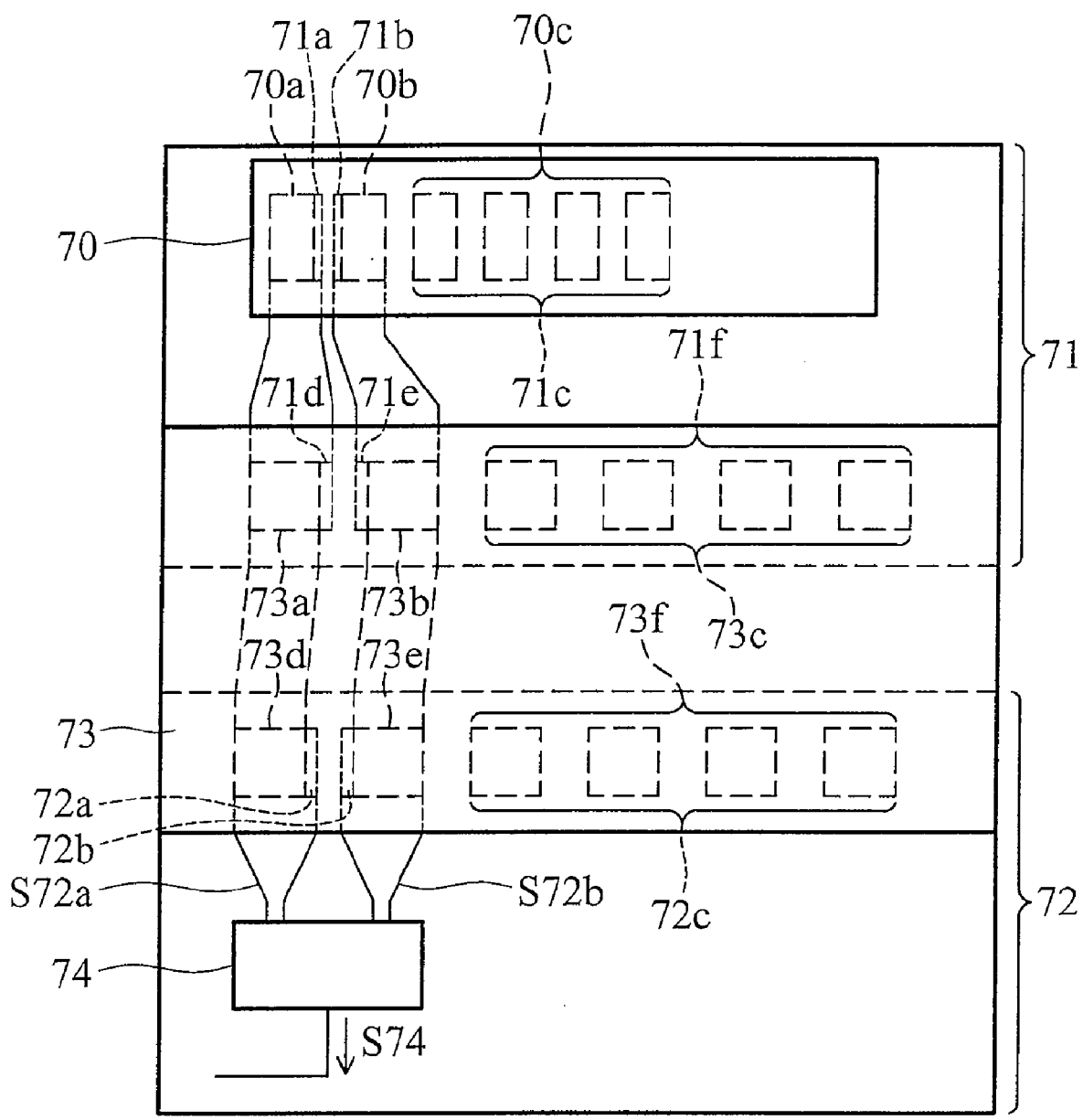
FIG. 7 shows a third embodiment of a misalignment detection device of the present invention.

In a third embodiment of a misalignment detection device in FIG. 7 of the present invention, a misalignment detection device 7 comprises an integrated circuit (IC) 70, a first substrate 71, a second substrate 72, a third substrate 73, and at least one detection unit 74. The third substrate 73 is electrically coupled to and disposed on the first substrate 71 and the second substrate 72. The first substrate 71 can be a transparent substrate (such as a glass substrate, or a quartz substrate), an opaque substrate (such as a wafer or porcelain substrate), or flexible substrate (such as acrylic polymer, rubber, epoxy polymer, or ester polymer). The second substrate 72 can be a printed circuit board (PCB), a flexible printed circuit (FPC), COF, or a combination thereof. The third substrate 73 can be a PCB, a FPC, a COF, or a combination thereof. In some embodiments, the first substrate 71 is a glass substrate, the second substrate 72 is a PCB, and the third substrate 73 is an FPC. Referring to FIG. 6A, the IC 70 comprises a plurality of bumps divided into function bumps 70*c* and two adjacent positioning bumps 70*a* and 70*b*. The first substrate 71 comprises a plurality of pads divided into function pads 71*c* and two adjacent positioning pads 71*a* and 71*b*, and the distance between any two of the function pads 71*c* is substantially greater than the distance between the positioning pads 71*a* and 71*b*. The first substrate 71 further comprises a plurality of electrodes divided into function electrodes 71*f* and two adjacent positioning electrodes 71*d* and 71*e*. The second substrate 72 comprises a plurality of electrodes divided into function electrodes 72*c* and two adjacent positioning electrodes 72*a* and 72*b*. The third substrate 73 comprises a plurality of electrodes on two sides. On one side of the third substrate 73, the electrodes are divided into function electrodes 73*c* and two adjacent positioning electrodes 73*a* and 73*b*; and on the other side thereof, the electrodes are divided into function electrodes 73*f* and two adjacent positioning electrodes 73*d* and 73*e*. In FIG. 7, because the function bumps 70*c* are superimposed on the function pads 71*c*, FIG. 7 shows the function bumps 70*c* on the upper level. Similarly, FIG. 7 shows the function electrodes 73*c* and 73*f*.

ACFs are disposed between the IC 70 and first substrate 71, between the first substrate 71 and between the third substrate 73, and between the second substrate 72 and the third substrate 73, and then applying a pressure on the IC 70 and first substrate 71, the first substrate 71 and the third substrate 73, and the second substrate 72 and the third substrate 73. Between the IC 70 and first substrate 71, the function bumps 70*c* and the function pads 71*c* should be aligned, and the positioning bumps 70*a* and 70*b* and the positioning pads 71*a* and 71*b* should be aligned in a first pressing region. Between the first substrate 71 and the third substrate 73, the function electrodes 71*f* and the function electrodes 73*c* should be aligned, and the positioning electrodes 71*d* and 71*e* and the positioning electrodes 73*a* and 73*b* should be aligned in a second pressing region. Between the second substrate 72 and the third substrate 73, the function electrodes 72*c* and the function electrodes 73*f* should be aligned, and the positioning electrodes 72*a* and 72*b* and the positioning electrodes 73*d* and 73*e* should be aligned in a third pressing region In the present embodiment, between the first substrate 71 and the third substrate 73, the distance between any two of the function electrodes 71f is substantially greater than the distance between the positioning electrodes 71d and 71e, or the distance between any two of the function electrodes 73c is substantially greater than the distance between the positioning electrodes 73a and 73b. Between the second substrate 72 and the third substrate 73, the distance between any two of the function electrodes 73c is substantially greater than the distance between the positioning electrodes 73d and 73e, or the distance between any two of the function electrodes 72c is substantially greater than the distance between the positioning electrodes 72a and 72b. In the following description, the distance between two function electrodes 71f is substantially greater than the distance between the positioning electrodes 71d and 71e, and the distance between the function electrodes 72c is substantially greater than the distance between the positioning electrodes 72a and 72b. The positioning electrodes 72a and 72b respectively receive signals S72a and S72b which have substantially different voltage levels. When the misalignment detection device 7 is applied in a display device. At least one of the signals S72a and S72b disregards display device functions. In other words, at least one of the signals S73a and S73b is not provided by the display device. For example, the signal S72a has the same level as a common voltage Vcom of the display device, and the signal S72b has a ground level GND provided by the misalignment detection device 7 or an external device (not shown).

The detection unit 72 is electrically coupled to and disposed on the second substrate 72. The detection unit 74 detects the signals S72a and S72b. When positioning shift occurs in at least one among the first to third pressing regions, the detection unit 74 outputs a fault signal S74. The display device displays incorrect images according to the fault signal S74, and the disposition error can be detected. For example, when the positioning shift occurs between the IC 70 and the first substrate 71 and the misalignment is thus caused between the function bumps 70c and the function pads 71c, the positioning bump 70a is electrically coupled to the positioning pad 71b or the positioning bump 70b is electrically coupled to the positioning pad 71a, at the same time, one function bump 70c is electrically coupled to a function pad adjacent to the substantially corresponding function pad 71c. One of the signals S72a and S72b is not at the original voltage level. When detecting that the voltage level of one of the signals S72a and S72b is changed, the detection unit 74 outputs the fault signal S74 to indicate the positioning shift occurs between the IC 70 and the first substrate 71.

In the present embodiment, the distance between two function pads 71c of the first substrate 71 is substantially greater than the distance between the positioning pads 71a and 71b thereof. When the positioning shift occurs between the IC 70 and the first substrate 71, the positioning bump 70a has been electrically coupled to the positioning pad 71b or the positioning bump 70b has been electrically coupled to the positioning pad 71a although any one of the function bumps 70c is not yet electrically coupled to a function pad adjacent to the substantially corresponding function pad 61c to cause the misalignment. Thus, the positioning shift can be known in advance, decreasing the probability of the misalignment. Similarly, by the greater distance between two function electrodes 71f substantially greater than the distance between the positioning electrodes 71d and 71e and the greater distance between two function electrodes 72c substantially greater than the distance between the positioning electrodes 72a and 72b, the positioning shift in the second region and/or the third pressing region can be known in advance.

In the present embodiment, the distance between two function pads 71c is substantially greater than the distance between the positioning pads 71a and 71b. In some cases, although the positioning shift does not occur between the IC 70 and the first substrate 71, the conductive particles of the ACF form a short path between the positioning bumps 70a and 70b and the positioning pads 71a and 71b due the shorter distance between the positioning pads 71a and 71b. In order to prevent the short path formed by the conductive particles of the ACF, the forms of the positioning pads 710a and 71b can be made as shown in FIG. 5. The distance between the positioning pads 71a and 71b has the maximum length Lmax and the minimum length Lmin. It is assumed that the distance between two function electrodes 71c is about 20 um, the maximum length Lmax is substantially equal to 20 um, and the minimum length Lmin is substantially less than 20 um. Thus, when the positioning shift occurs between the IC 70 and the first substrate 71 and the misalignment is not yet caused between the function bumps 70c and the function pads 71c, the positioning bump 70a has been electrically coupled to the positioning pad 71b or the positioning bump 70b is coupled to the positioning pad 71a, thereby the positioning shift between the IC 70 and the first substrate 71 can be known in advance. Moreover, because the distance between one portion of the positioning pad 71a and one portion of the positioning pad 71b is less than about 20 um, the short path formed by the conductive particles of the ACF can be prevented.

Similarly, the forms of the positioning electrodes 71d and 71e of the first substrate 71 and the positioning electrodes 72a and 72b of the second substrate 72 can be made as shown in FIG. 5.

In present embodiment, the positioning bumps 70a and 70b are disposed on an outer side of the IC 70, in other words, the positioning bumps 70a and 70b are disposed on one of the two sides of the function bumps 70c, as shown in FIG. 7. On the first substrate 71, the positioning electrodes 71d and 71e are disposed on an outer side of the first substrate 71, in other words, the positioning electrodes 71d and 71e are disposed on one of the two sides of the function electrodes 71f. Similarly, on the second substrate 72, the positioning electrodes 72a and 72b are disposed on one of the two sides of the function electrodes 72c. On the third substrate 73, the positioning electrodes 73a and 73b are disposed on one of the two sides of the function electrodes 73c, and the positioning electrodes 73d and 73e are disposed on one of the two sides of the function electrodes 73f.

The display device described above can be a liquid crystal display, an electroluminescent display, a field-emission display, a nano-carbon tube display, or other display. An electroluminescent display has organic (small molecules or macromolecules) or inorganic types. In the above embodiments of the present invention, a liquid crystal display is given as an exemplary display device.

While the present invention has been described by way of example and in terms of the preferred embodiments, it is to be understood that the present invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A misalignment detection device comprising:
   a substrate comprising a first positioning pad and a second positioning pad adjacent to the first positioning pad;

at least one integrated circuit (IC), disposed on the substrate, comprising a first positioning bump and a second positioning bump adjacent to the first positioning bump, wherein the first positioning bump is electrically separated from the second positioning bump, the first positioning bump and the second positioning bump substantially correspond to the first positioning pad and the second positioning pad, respectively; and at least one detection unit electrically coupled to the substrate, wherein the at least one detection unit outputs a fault signal in response to a positioning shift occurring between the first and second positioning pads and the first and second positioning bumps;

wherein the first positioning pad comprises a first rectangular portion and a second rectangular portion whose area is smaller than the area of the first rectangular portion, and the second positioning pad comprises a third rectangular portion and a fourth rectangular portion whose area is smaller than the third rectangular portion; and wherein the second rectangular portion and the fourth rectangular portion are disposed between the first rectangular portion and the third rectangular portion.

2. The device of claim 1, wherein the first positioning pad is adapted to receive a first signal, the second positioning pad is adapted to receive a second signal, and the at least one detection unit detects that a level of the first or second signal changes as a result of the positioning shift.

3. The device of claim 1, wherein the IC comprises a plurality of function bumps, the substrate comprises a plurality of function pads, and each function pad substantially corresponds to each function bump.

4. The device of claim 3, wherein a distance between any two of the function pads is substantially greater than a distance between the first positioning pad and the second positioning pad.

5. The device of claim 3, wherein a distance between any two of the function pads is greater than or equal to the minimum distance between the first positioning pad and the second positioning pad.

6. The device of claim 3, wherein the maximum distance between the first positioning pad and the second positioning pad is substantially equal to a distance between any two of the function pads.

7. The device of claim 1, wherein the first and second positioning bumps are disposed on an outer side of the IC.

8. The device of claim 1 further comprising:
an anisotropic conductive film disposed between the substrate and the IC.

9. The device of claim 3, wherein the distance between the first and second positioning pads has a maximum length and a minimum length, the distance with the maximum length between the first and second positioning pads is the distance between the first rectangular portion of the first positioning pad and the third rectangular portion of the second positioning pad, and the distance with the maximum length between the first and second positioning pads is substantially equal to the distance between two of the function pads.

10. The device of claim 9, wherein the distance with the minimum length between the first and second positioning pads is the distance between the second rectangular portion of the first positioning pad and the fourth rectangular portion of the second positioning pad, and the distance with the minimum length between the first and second positioning pads is substantially less than the distance between two of the function pads.

* * * * *